(12) United States Patent
Baier et al.

(10) Patent No.: US 8,045,594 B2
(45) Date of Patent: Oct. 25, 2011

(54) SURFACE-EMITTING EXTERNAL CAVITY LASER DEVICE

(75) Inventors: Johannes Baier, Wuerselen (DE); Holger Moench, Vaals (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/667,243

(22) PCT Filed: Jul. 1, 2008

(86) PCT No.: PCT/IB2008/052640
§ 371 (c)(1),
(2), (4) Date: Dec. 30, 2009

(87) PCT Pub. No.: WO2009/004577
PCT Pub. Date: Jan. 8, 2009

(65) Prior Publication Data
US 2010/0189142 A1    Jul. 29, 2010

(30) Foreign Application Priority Data
Jul. 5, 2007   (EP) ...................................... 07111811

(51) Int. Cl.
*H01S 3/10* (2006.01)
(52) U.S. Cl. .......................................... 372/20; 372/22
(58) Field of Classification Search .................... 372/20, 372/22, 98; 359/326, 328
See application file for complete search history.

(56) References Cited

U.S. PATENT DOCUMENTS

| | | | |
|---|---|---|---|
| 6,366,592 B1 | 4/2002 | Flanders | |
| 6,947,229 B2 * | 9/2005 | Zbinden et al. | 359/819 |
| 2002/0126369 A1 | 9/2002 | Yamamoto et al. | |
| 2002/0172239 A1 * | 11/2002 | McDonald et al. | 372/20 |
| 2004/0165639 A1 | 8/2004 | Lang et al. | |
| 2004/0165641 A1 * | 8/2004 | Garnache et al. | 372/97 |
| 2005/0226304 A1 * | 10/2005 | Schwarz et al. | 372/98 |
| 2005/0286573 A1 | 12/2005 | Hand et al. | |
| 2006/0029120 A1 | 2/2006 | Mooradian et al. | |
| 2006/0280219 A1 * | 12/2006 | Shchegrov | 372/99 |
| 2008/0101426 A1 | 5/2008 | Komatsu et al. | |

FOREIGN PATENT DOCUMENTS
WO        2006105149 A2    10/2006

* cited by examiner

*Primary Examiner* — Jessica Stultz
*Assistant Examiner* — Phillip Nguyen

(57) ABSTRACT

A surface-emitting extended cavity laser with intracavity frequency conversion is provided with at least one surface-emitting laser element with multiple layers to obtain laser light at a fundamental frequency, reflector means, spaced from the laser element to form an external cavity, a frequency conversion device, arranged within the external cavity to generate light at a second frequency and tunable optical band-pass filter means, arranged within the external cavity and detector means, where said optical band-pass filter means are tunable upon a signal, which is obtained by the detector means to enable a frequency control at the fundamental frequency.

20 Claims, 2 Drawing Sheets

SURFACE-EMITTING EXTERNAL CAVITY LASER DEVICE

FIELD OF THE INVENTION

The invention relates to a surface-emitting external cavity laser device with intracavity frequency conversion, a method related thereto and an image projection unit.

BACKGROUND OF THE INVENTION

Vertical surface-emitting lasers (VCSEL) are known in the art for low manufacturing-cost. Recently, vertical surface-emitting lasers with an external cavity (VECSEL) were developed, which allow large-area beams to be generated efficiently with high beam quality. By placing a frequency conversion device in the external cavity it is now possible to generate laser light at wavelengths, for which a direct generation of laser light is not possible at reasonable cost and effort.

A typical field of application of such a device are RGB image projectors, for which laser light sources are ideal due to their high luminance and high beam quality. While red and blue laser light can be generated directly by laser diodes at a reasonable cost, it is currently not feasible to generate green laser light directly using a laser diode. Therefore, vertical surface-emitting external cavity laser devices with intracavity frequency conversion are promising for this application.

Within vertical surface-emitting external cavity laser devices with intracavity frequency conversion, laser light is generated in a semiconductor laser element, similar to the laser chip of a VCSEL device, comprising at least one gain layer with usually several quantum wells and at least one highly reflective distributed Bragg reflector. A laser mirror is arranged spaced from the laser element to form an external cavity, which completes the laser resonator. When the laser element is operated, this setup generates light at a fundamental frequency. By placing a frequency conversion device, for example a non-linear crystal, in the external cavity, light at a second frequency being different from the fundamental frequency, e.g. at a harmonic frequency, is generated. The light at the second frequency can then easily be coupled out of the external cavity and be used for the desired application.

A problem arises, since the performance of both the semiconductor laser element and frequency conversion device typically are temperature dependent. The conversion efficiency of the frequency conversion device from the fundamental frequency to the second frequency strongly depends on an exact match of its phase-matching bandwidth, which is strongly temperature-dependent for most of the common efficient frequency conversion materials. If the gain bandwidth of the laser element drifts due to a change of the temperature, the gain bandwidth may drift out of the phase-matching bandwidth, which may result in low conversion efficiency and thus low power of the light at the second frequency. Usually, this problem can be addressed by an active temperature control of both, the laser element and the frequency conversion device.

Document WO 2006/105249 discloses a frequency stabilized vertical extended cavity surface-emitting laser, which comprises a semiconductor laser chip for generation of laser light at a fundamental frequency, an output coupler, defining an external cavity and a non-linear crystal for generating light at the second-harmonic frequency arranged within the external cavity together with a thin-film interference filter.

Here, the thin-film filter serves to constrain the emission wavelength of the laser at the phase-matching bandwidth of the non-linear crystal. Although due to this setup, a temperature control of the laser chip can be omitted, it is still necessary to actively control the temperature of the non-linear crystal, which is costly and may lead to significant problems when integrating the laser device in small projection units.

It is therefore an object to provide a surface-emitting external cavity laser device with intracavity frequency conversion, which is universally applicable and may be manufactured cost-efficiently.

SUMMARY OF THE INVENTION

The object of the invention is solved by a surface-emitting external cavity laser device with intracavity frequency conversion according to claim 1, an image projection unit according to claim 10 and a method for generation of intracavity frequency converted light according to claim 11. Dependent claims relate to preferred embodiments of the invention.

The laser device according to the invention comprises at least one surface-emitting laser element with multiple semiconductor layers, where at least one gain layer and one reflective layer is arranged to obtain light at a fundamental frequency. The gain layer typically comprises several quantum well semiconductor structures for emission of photons at a fundamental frequency, for example GaAs with AlGaAs or InGaAs with GaAs may be used.

The at least one reflective layer is highly reflective at the fundamental frequency and may be for example a distributed bragg reflector (DBR), which allows a very high reflectivity of greater than 99.8%. The laser resonator is completed by reflector means, arranged spaced from the laser element and reflective at the fundamental frequency to form an external cavity. A frequency conversion device is arranged within the external cavity to generate light at a second frequency, which is typically a harmonic frequency of the fundamental frequency. The frequency conversion device thus converts the light, generated by the laser element at the fundamental frequency, which travels through the external cavity, into light at a second frequency being different from the fundamental frequency. Usually, the second frequency is the second-harmonic frequency of the fundamental frequency, although also frequency tripling or "quadrupling" is possible as well as any other frequency down- or up-conversion, the latter e.g. as well by frequency mixing methods well-known to the skilled person.

The light at the second frequency can be coupled out of the external cavity by means of a suitable output coupler to be used for the desired application. This may be, for example, achieved by providing the reflector means with a suitable coating, so that the light at the second frequency may be coupled out through the reflector means, e.g. a dichroic mirror.

Frequently used and preferred frequency conversion devices are non-linear crystals, for example and without limitation, periodically poled lithium niobate (PPLN), periodically poled lithium tantalate (PPLT) or KTP, where PPLN is especially preferred. These materials can be designed with the desired wavelength conversion properties. Such frequency conversion devices are usually based on quasi phase matching within a narrow phase-matching bandwidth, where the phase-matching bandwidth is reciprocally proportional to the crystal length. For example, the phase-matching bandwidth of a frequency doubling PPLN crystal converting IR radiation from 1060 nm to 530 nm in the visible is approx. 1 nm for a 2 mm long crystal and even narrower for a typical crystal length of approx 3-5 mm. For an efficient generation of light at the second frequency, the fundamental frequency has to fall within the phase-matching bandwidth of the frequency conversion device.

The fundamental frequency of the laser device can be chosen within a large wavelength range by appropriate selection of the quantum well structure, the DBR and the set-up of the reflector means. Although this allows setting the fundamental frequency to the phase-matching bandwidth of the frequency conversion device at a defined temperature, additional measures have to be taken since the properties of both the laser element and of the frequency conversion device are temperature dependent.

Therefore, according to the invention, tunable optical band-pass filter means are arranged within the external cavity, to avoid a drift of the fundamental frequency out of the phase-matching bandwidth of the frequency conversion device.

Using band-pass filter means, it is possible to constrain the emitted light of the laser element to a peak wavelength of the band-pass filter. By tuning the filter means, it is advantageously possible to set the wavelength of the emitted light at the fundamental frequency to the phase-matching bandwidth of the frequency conversion device, even if the temperature of the laser element or the frequency conversion device changes. It is thus not necessary to provide temperature control for these components, since upon a drift of the phase-matching bandwidth of the frequency conversion device, it is possible to actively adapt the peak wavelength of the band-pass filter means and thus the fundamental frequency to the phase-matching bandwidth of the frequency conversion device, so that maximum power of light at the second frequency can be obtained.

The band-pass filter means are tunable upon a signal, obtained by detector means. The detector means are designed to detect at least one physical value, which allows maximizing the power of light at the second frequency. The detector means therefore generate a signal, which allows tuning the band-pass filter. The detector means may be connected directly to the optical band-pass filter or using any intermediate control circuitry. The detector means and if necessary, any control circuitry may preferably be formed on the semiconductor substrate of the laser element to simplify the set-up of the device.

The laser device may contain further electrical or optical elements to further enhance the light generation properties. For example, the laser element may preferably comprise a second partly reflective DBR, arranged on the side of the gain layer, which faces the external cavity, so that the gain layer is sandwiched between two DBR structures. This preferred arrangement provides a separation of the gain medium from losses in the external cavity. Most preferred, the second DBR has a reflectivity at the fundamental frequency in a range of 85%-95%. This set-up using two DBR further enables to electrically pump the gain layer, for example by suitable doping of the DBR layers.

Alternatively to an electrical pumping of the gain layer, an optical pumping using a second laser element may be used. Further, the external cavity may comprise a polarisation control element, e.g. a two-dimensional line grating structure, since the frequency conversion is usually dependent on a defined polarisation of the light at the fundamental frequency. A focusing element, for example a focusing lens, may be present to further enhance the lasing or frequency conversion properties of the device.

As explained above, the detector means are designed to detect at least one physical value, which allows maximising the power of light at the second frequency. Normally, the change in temperature of the frequency conversion device is a crucial parameter, so that the detector means may comprise a temperature detector, configured to measure the temperature of the frequency conversion device or a change of its temperature. Using a suitable database, it may be possible to determine the phase-matching bandwidth wavelength corresponding to a temperature of the frequency conversion device and to tune the band-pass filter means to this wavelength.

In a preferred embodiment of the invention, the detector means comprise an optical detector, operable to detect the power of the light at the second frequency. The present embodiment allows advantageously to maximise the optical power at the second frequency directly, independent of the cause for a potential decrease in the power. The optical detector may be, for example, a pin photodiode or any other optical detector suitable for the desired second frequency, known in the art. The detector means may further comprise control circuitry, for example a PID controller, to allow efficient compensation of a drift in the wavelength. As mentioned before, the detector means and/or the optical detector may preferably be formed on the semiconductor substrate of the laser element, to reduce the overall complexity of the device.

The optical detector may be placed inside the external cavity of the laser device, to obtain a small form factor of the device, although it is preferred to place the optical detector outside of the external cavity to reduce losses within the external laser cavity. For example, a small percentage of the beam of light at the second frequency, which is coupled out of the external cavity, may be directed to the optical detector by a beam splitter as known in the art.

The tunable optical band-pass filter means may be of any suitable type, which allows filtering the light in the external cavity. The bandwidth of the band-pass filter means shall be adapted to the particular frequency conversion device, for example, using a typical PPLN crystal with 3 mm length for converting IR radiation at 1060 nm to the green visible range, the bandwidth of the filter shall be approx. 0.7 nm FWHM.

In order to increase the efficiency for frequency conversion within the external cavity, it is preferred to choose the bandwidth of the band-pass filter means extremely small, so that the number of longitudinal modes of the external cavity, which allow generation of laser light at the fundamental frequency, is limited. This can be achieved by choosing the bandwidth of the filter smaller than the wavelength spacing of adjacent longitudinal extended cavity modes. Most preferred the number of longitudinal modes at the fundamental frequency is 1. For example, using an external cavity with a length of 1 cm at a fundamental wavelength of 1060 nm, this results in a required filter bandwidth of lower than 0.06 nm FWHM.

Preferably, the tunable optical band-pass filter means comprises a tunable optical band-pass dielectric filter. Such a filter may be advantageously designed with very narrow-band transmission properties. Tuning of the dielectric filter can be achieved by varying the refractive index of the filter material, which is generally known in the art. Exemplary it is possible to vary the refractive index of a dielectric filter made by pressure-sensitive filter-material by varying a pressure, applied to the filter, for example, using a piezo element. Further, it is possible to tune the filter by varying the temperature of the dielectric filter, for example using a suitable heater/cooler arrangement, i.e. a Peltier element. Although this would make a temperature control necessary, it is more simple to actively control the temperature of a dielectric filter than the temperature of the laser element or the frequency conversion device.

Most preferred, the optical band-pass filter means comprise a Fabry-Perot interferometer and an actuating element for tuning a resonance frequency of the interferometer. Fabry-Perot interferometers (etalons) are generally known in the art and are based on interference between two dielectric reflecting surfaces. The resonance frequencies of such an interferometer can be tuned by a variation of the optical length between the reflecting surfaces. It should be noted, that although a Fabry-Perot interferometer usually has a plurality of resonance frequencies and thus a plurality of pass-bands, a "quasi" single band-pass characteristic can be obtained when the free spectral range between two resonance peaks of the interferometer is chosen larger than the emission bandwidth and possible temperature drift bandwidth of the laser element. For example, for a fundamental frequency of 1060 nm, and a typically InGaAs-type laser element, the maximal optical length of the filter would be 10 μm.

To enable a tuning of the band-pass filter and thus to vary the optical length between the reflecting surfaces, any suitable actuator may be used, for example a micro-electro-mechanical (MEMS) actuator. In the above shown example, the actuator should allow a deflection of at least 100 nm. Preferably, the actuator is a piezo actuator. Piezo actuators advantageously allow precise and fast positioning with a sub-nanometer resolution. Most preferably, stack-type piezo actuators are used. Depending on the type of piezo actuator, a drive circuit may be necessary which can be easily integrated on the semiconductor substrate of the laser element.

In a preferred embodiment of the invention, the frequency conversion device and the band-pass filter are formed integrally. Such a design advantageously reduces the necessary parts of the laser device. Preferably, the frequency conversion device comprises a first and a second element, spaced apart on an optical axis of the laser device, wherein the first and second element having opposing surfaces, which form the Fabry-Perot interferometer. Both surfaces are provided with a coating, to obtain a high reflectivity at the fundamental frequency. Most preferred the coating is further designed anti-reflecting for the second frequency to achieve an efficient out-coupling of the light at the second frequency.

With this set-up, the interferometer is advantageously formed between the two elements of the frequency conversion device. Tuning of the band-pass filter can easily be achieved by displacing either the first or the second element along the optical axis using the aforementioned actuators. The two reflecting surfaces should be kept parallel to each other.

The first and/or second element may be designed with frequency conversion properties. Preferably both elements have the same refractive index, since this ensures that the optical beam is only displaced parallel to the optical axis, which omits the need for costly angular compensation within the external cavity of the laser device. Furthermore it is preferred to provide the surfaces of the elements, which do not contribute to the Fabry-Perot interferometer with an anti-reflection coating at least at the fundamental frequency in order to further minimise reflection losses in the external cavity.

In a preferred embodiment of the invention, the opposing surfaces of the first and second element, which form the Fabry-Perot interferometer, are parallel to each other and are inclined towards the optical axis. This preferred set-up enables to freely choose the reflectivity of the surfaces, without the risk that these surfaces act as laser mirrors when the reflectivity at the fundamental frequency is too high, which would possibly allow lasing without the band-pass filter enhancement of the interferometer. Further, high reflectivity values of the opposing surfaces advantageously enhance the contrast and allow a narrow bandwidth of the interferometer.

Preferably, the opposing surfaces are inclined towards the optical axis by an angle higher than 2°. Large tilt angles higher than 2° allow to incorporate polarisation control into the reflective surfaces of the interferometer, which advantageously enhances a cost-efficient and compact set-up of the device. Polarisation control of the light at the fundamental frequency is important, because, as aforementioned, the frequency conversion is usually dependent on a defined polarisation of the light at the fundamental frequency.

While for perpendicular incidence, the reflection properties of a dielectric (optical) surface are constant for all possible polarisations of the incident light, the reflection coefficient is polarisation-dependent for non-perpendicular incidence. Large tilt angles however require a very small spacing of the interferometer surfaces on the optical axis in order to avoid that the multiple reflected beams lose spatial overlap, which would reduce the performance of the interferometer. Preferably, the tilt angle is between 10° and 45°. Most preferred, the coatings, provided on the opposing surfaces are multilayer coatings, which can be advantageously designed with a strong polarisation control.

As mentioned before, the reflector means are designed to be highly reflective at the fundamental frequency to allow lasing within the external cavity and preferably show anti-reflective properties at the second frequency to enable efficient out-coupling of light at the second frequency. For this purpose, a common laser mirror with a suitable coating may be used. Alternatively, a volume Bragg grating, designed with suitable properties as stated above, may replace the laser mirror.

According to a preferred embodiment of the invention, the reflector means are a coating, provided on the optical band-pass filter or on the frequency conversion device. This embodiment advantageously further simplifies the set-up of the device. To enable lasing within the external cavity, the coating is highly reflective at the fundamental frequency and preferably shows anti-reflecting properties at the second frequency. To achieve stable laser operation, it may be necessary to provide a focusing lens. The focusing lens may be arranged within the external cavity or on the side of the laser element, which faces the external cavity, or may be formed as a thermal lens in the semiconductor substrate of the laser element, as known in the art. Preferably, the reflector means are formed as a coating on the surface of the second element, which does not form the Fabry-Perot interferometer.

An image projection unit according to the invention comprises at least one surface emitting external cavity laser device as aforementioned, an electronic control unit and at least one spatial light modulator. A laser device allows to generate a beam of light with a high beam quality and high luminance, thus is ideal for projector applications. Since it is not possible at reasonable cost and effort to directly generate green laser light for an RGB projection unit, a surface-emitting external cavity laser device with intracavity frequency conversion as discussed above is very advantageous for such applications. By way of example, using a properly designed PPLN crystal as frequency conversion device, it is possible to generate green light at 532 nm by using an IR laser element, which emits light at a fundamental wavelength of 1064 nm. Naturally, the invention is not limited to the generation of green light; other colours may be generated as well by a suitable design of the components. To further enhance the luminance of the projection unit, it is preferred to use an array of laser elements within a single laser device or an array of laser devices per colour.

The spatial light modulator may be any device, which allows to generate an image according to a given colour distribution, e.g. a video signal. Such a spatial light modulator may be a binary light valve, for example a DLP device, an LCOS (liquid crystal on silicon) modulator, an LCD device or a Micro-Electromechanical (MEMS) scanner, which may generate an image by scanning the laser beam.

It shall be understood that the image projection unit may comprise other electrical, optical or mechanical components, which may be necessary depending on the desired application.

According to the inventive method, intracavity converted light is generated with a surface emitting external cavity laser device, comprising at least one surface-emitting laser element with multiple layers, where at least one gain layer and a reflective layer are arranged to obtain laser light at a fundamental frequency, reflector means, spaced from the surface-emitting laser to form an external cavity, a frequency conversion device, arranged within the external cavity to generate light at a second frequency different from the fundamental frequency, which typically is a harmonic frequency of the fundamental frequency, tunable optical band-pass filter means, arranged within the external cavity and detector means, where said band-pass filter means are tuned upon a signal, which is obtained by the detector means, to maximize the output power of the laser device at the second frequency.

For tuning the band-pass filter, any suitable control signal may be used. The signal may be generated directly using the detector means or may be generated by suitable control circuitry, for example a microcontroller. To actively maximise the output power at the second frequency, suitable iterative and recursive maximisation methods are known in the art. Such a method may be operated actively in a closed-loop for real-time operation or may be operated within given time-intervals.

BRIEF DESCRIPTION OF THE DRAWINGS

The above and other objects, features and advantages of the present invention will become apparent from the following description of preferred embodiments, in which.

DETAILED DESCRIPTION OF EMBODIMENTS

Figure 1:
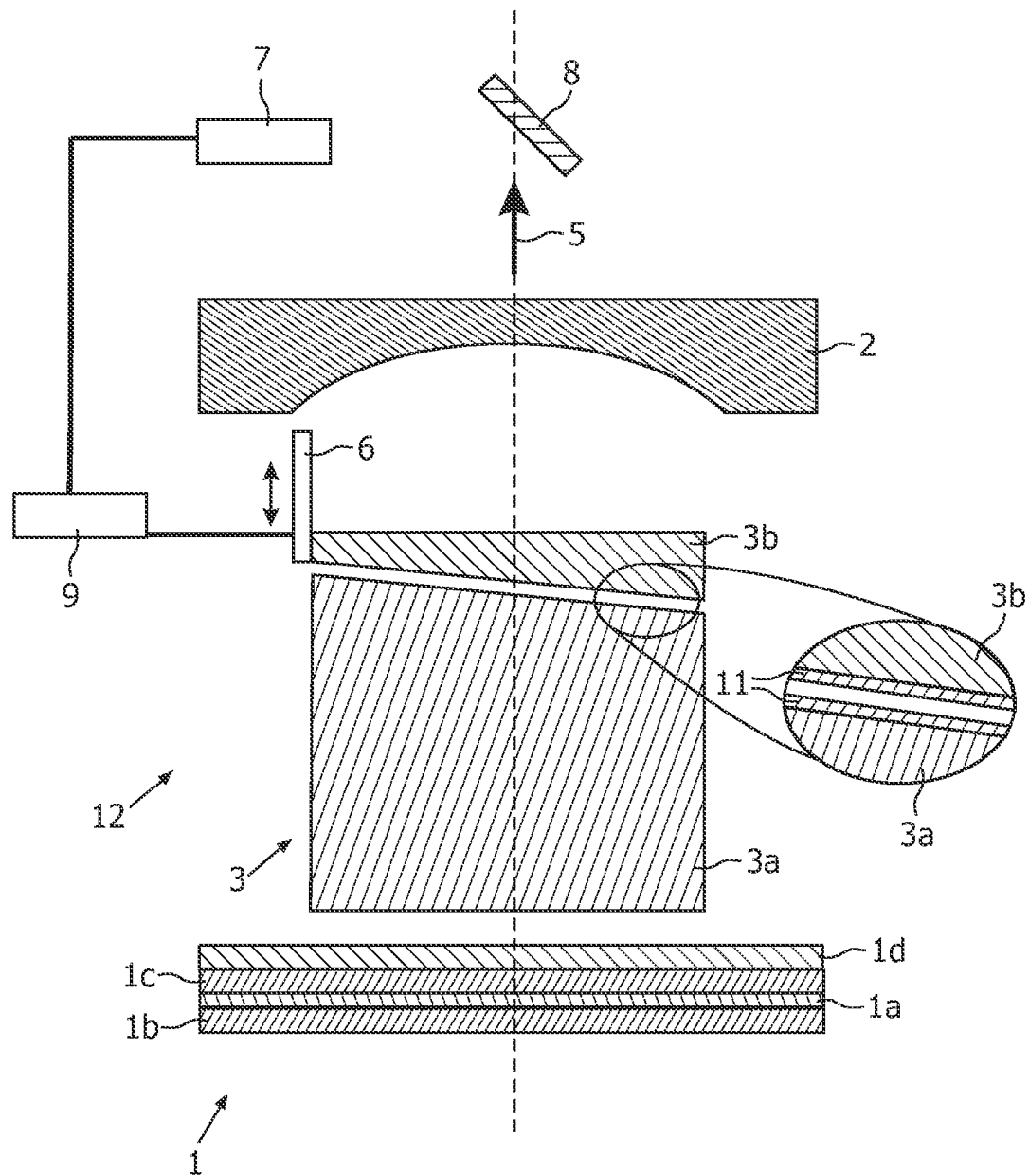
FIG. 1 shows a first embodiment of the laser device according to the invention in a cross-sectional view and FIG. 2 shows a second embodiment of the laser device according to the invention.

FIG. 1 shows a first embodiment of the surface-emitting external cavity laser device with intracavity frequency conversion according to the invention. A semiconductor surface-emitting laser element 1 is designed with a gain layer 1a, sandwiched between two distributed Bragg reflectors (DBR) 1b, 1c. Substrate 1d serves to mechanically support the layers of the laser element 1 and is transparent at the fundamental frequency. The set-up described above and shown in the figure is similar to the set-up of a typical VCSEL laser device.

The gain layer 1a comprises InGaAs quantum wells embedded in GaAs, designed to emit light at a fundamental frequency or wavelength of 1064 nm. The two DBR 1b, 1c form an internal laser cavity, therefore the DBR 1b is highly reflective (>99.8%) at the fundamental frequency. The reflectivity of DBR 1c is lower to allow out-coupling to and feedback from an external cavity 12, formed by a laser mirror 2. DBR 1b is p-doped and DBR 1c is n-doped to supply an electrical pump current to the gain layer 1a to enable electrical pumping. Naturally, it is also possible to dope the DBR 1b and 1c in reverse order, depending upon the desired application.

Laser mirror 2 exhibits high reflectivity at the fundamental frequency and is coated with an anti-reflection coating (not shown) on its inner surface, which faces the external cavity 12 at least for a second frequency. Alternatively, the laser mirror 2 could be replaced by a volume bragg grating with suitable properties as known in the art.

Light at the second frequency is generated by a frequency conversion device 3, which comprises a first element 3a and a second element 3b. Element 3a is made from a periodically poled lithium niobate non-linear material, designed to convert light at the fundamental frequency to light at the second frequency. Here, the second frequency is the second-harmonic frequency of the fundamental frequency with a wavelength of 532 nm. Element 3b consists of optical glass, transparent at the fundamental and the second frequency. Element 3b may alternatively consist of the material of Element 3a, e.g. lithium niobate. Elements 3a, 3b show the same refractive index, so that the beam of light travelling within the cavity 12 is not displaced angularly.

Since the frequency conversion device 3 has a narrow phase matching bandwidth for frequency conversion, which may drift for example upon a change in temperature, frequency control at the fundamental frequency is needed.

Therefore, the opposing surfaces of the elements 3a and 3b integrally form a tunable Fabry-Perot interferometer to enable control of the emission frequency of the laser element 1 and to narrow the bandwidth of the emitted light at the fundamental frequency. Both surfaces are provided with a coating 11 to obtain high reflectivity at the fundamental frequency, as can be depicted from the enlarged section in FIG. 1.

To tune the Fabry-Perot interferometer, the distance between the elements 3a and 3b is varied, in a direction parallel to the optical axis, which is denoted by a dotted line in the figure. Therefore, a stack type piezo actuator 6 is arranged at the second element 3b. The piezo actuator 6 is connected to and controlled by a control unit 9. As an input to the control unit 9, an optical detector 7 arranged outside of the external cavity 12 is configured to measure the power of the light at the second frequency. The detector 7 detects the power of the beam of light 5 at the second frequency, which is coupled out of the external cavity 12 through the laser mirror 2. Therefore, the beam 5 is divided using beam splitter 8, which directs a small part of the light at the second frequency towards the detector 7.

Using the arrangement described above, it is possible to actively determine the power of the light at the second frequency and to use this information to optimise the distance between the two elements 3a and 3b, thereby tuning the band-pass frequency of the Fabry-Perot interferometer. This allows adapting the frequency of the light, emitted by the laser element 1 to the phase matching bandwidth of the non-linear material. It is thus possible to easily maximise the power of light at the second frequency in a closed-loop operation. A maximisation may be conducted using methods as known in the art, for example using a gradient method.

As can be further depicted from the figure, the opposing surfaces of the elements 3a and 3b are parallel to each other and are inclined towards the optical axis. The tilt angle avoids the risk that the surfaces act as laser mirrors.

Figure 2:
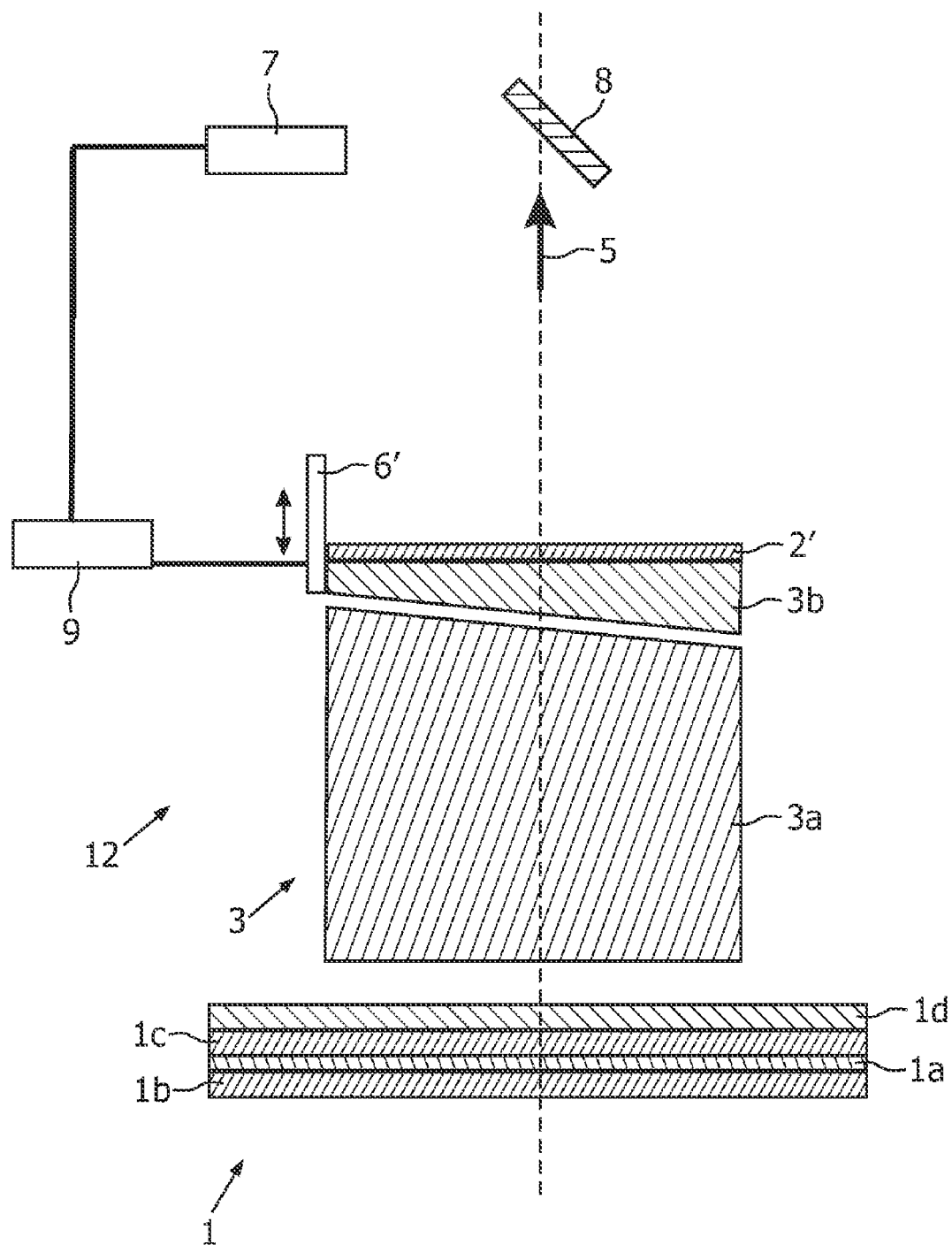

FIG. 2 shows a further embodiment of a laser device according to the invention. In general the set-up of the embodiment according to FIG. 2 is analogue to the embodiment of FIG. 1. Therefore, corresponding reference signs are used.

In the present embodiment, in contrast to the embodiment of FIG. 1, the external cavity 12 is formed by a dielectric coating 2' arranged on the second element 3b of the frequency conversion device 3. The arrangement according to the present embodiment thus reduces the complexity of the device. For tuning the Fabry-Perot interferometer and thus varying the distance between the first element 3a and the second element 3b, a MEMS actuator 6' is arranged. Stable laser operation is achieved, as a thermal focusing lens forms during operation within the substrate 1d of the laser element 1.

The invention has been illustrated and described in detail in the drawings and foregoing description. Such illustration and description are to be considered illustrative or exemplary and not restrictive; the invention is not limited to the disclosed embodiments.

In the claims, the word "comprising" does not exclude other elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A surface-emitting external cavity laser device with intracavity frequency conversion comprising:
   at least one surface-emitting laser element with multiple layers, comprising at least one gain layer and a reflective layer arranged to obtain laser light at a fundamental frequency;
   reflector means, spaced from the surface-emitting laser element to form an external cavity;
   a frequency conversion device, arranged within the external cavity to generate light at a second frequency different from the fundamental frequency, the frequency conversion device comprising a first element and a second element spaced apart on an optical axis of the laser element, the first and second elements having opposing surfaces provided with a coating; and
   tunable optical band-pass filter means integrally formed with the frequency conversion device, arranged within the external cavity,
   wherein the band-pass filter means are tunable by varying a distance between the opposing surface of the first and second elements based upon a signal generated by detector means.

2. The device according to claim 1, wherein the detector means comprise an optical detector, operable to detect power of the light at the second frequency.

3. The device according to claim 1, wherein the band-pass filter means comprise a tunable dielectric filter.

4. The device according to claim 1, wherein the band-pass filter means comprise a Fabry-Perot interferometer and an actuating element for tuning a resonance frequency of the interferometer.

5. The device according to claim 4, wherein the actuating element is a piezo actuator.

6. The device according to claim 1, wherein the opposing surfaces of the first elements are parallel to each other and inclined towards the optical axis.

7. The device according to claim 6, wherein the opposing surfaces are inclined towards the optical axis by an angle higher than 2°.

8. The device according to claim 1, wherein the reflector means are a coating, provided on the optical band-pass filter means or on the frequency conversion device.

9. Image projection unit with at least one surface emitting external cavity laser device according to claim 1, an electronic control unit and at least one spatial light modulator.

10. A surface-emitting external cavity laser device with intracavity frequency conversion comprising:
    a surface-emitting laser element comprising at least one gain layer and a reflective layer arranged to obtain laser light at a fundamental frequency;
    a reflector spaced from the surface-emitting laser element to form an external cavity;
    a frequency conversion device, arranged within the external cavity to generate light at a second frequency different from the fundamental frequency, the frequency conversion device comprising a first element and a second element spaced apart on an optical axis of the laser element, wherein the first and second elements have opposing surfaces provided with a coating that is reflective at the fundamental frequency, forming a tunable band-pass filter;
    a detector for detecting light at the second frequency; and
    an actuator for tuning the band-pass filter based upon a signal generated by the detector.

11. The device of claim 10, wherein the coated opposing surfaces of the first and second elements form a Fabry-Perot interferometer.

12. The device of claim 11, wherein the coating further is anti-reflective at the second frequency.

13. The device of claim 10, wherein the opposing surfaces of the first and second elements are parallel to each other and inclined towards the optical axis.

14. The device according to claim 13, wherein the opposing surfaces of the first and second element are inclined towards the optical axis by an angle higher than two degrees.

15. The device according to claim 13, wherein the reflector comprises a laser mirror exhibiting high reflectivity at the fundamental frequency.

16. The device of claim 15, wherein the actuator comprises a piezo actuator.

17. The device according to claim 10, wherein the reflector comprises a coating provided on a surface of the second element of the frequency conversion device opposite the surface opposing the first element of the frequency conversion device.

18. The device of claim 17, wherein the actuator comprises a MEMS actuator.

19. The device of claim 10, wherein the first and second elements have the same refractive index.

20. A Fabry-Perot interferometer device formed in an external cavity of a surface-emitting external cavity laser device, the external cavity being formed by a reflector spaced apart from a surface-emitting laser that emits light at a fundamental frequency, the Fabry-Perot interferometer device comprising:
    a first element configured to convert the light at the fundamental frequency to light at a second frequency, the first element having a first surface provided with a coating; and
    a second element spaced apart from the first element on an optical axis of the laser, the second element having a second surface opposing the first surface of the first element and provided with the coating,
    wherein a distance between first and second surfaces of the first and second elements is variable in a direction parallel to the optical axis of the laser for tuning a band-pass frequency of the Fabry-Perot interferometer in response to detected power of the light at the second frequency.

* * * * *